(12) United States Patent
Gersdorff et al.

(10) Patent No.: US 10,734,584 B2
(45) Date of Patent: Aug. 4, 2020

(54) COATING DEVICE AND COATING METHOD

(71) Applicant: AIXTRON SE, Herzogenrath (DE)

(72) Inventors: Markus Gersdorff, Herzogenrath (DE); Markus Jakob, Monschau (DE); Markus Schwambera, Aachen (DE)

(73) Assignee: AIXTRON SE, Herzogenrath (DE)

( * ) Notice: Subject to any disclaimer, the term of this patent is extended or adjusted under 35 U.S.C. 154(b) by 0 days.

(21) Appl. No.: 16/307,110

(22) PCT Filed: Jun. 8, 2017

(86) PCT No.: PCT/EP2017/063893
§ 371 (c)(1),
(2) Date: Dec. 4, 2018

(87) PCT Pub. No.: WO2017/216014
PCT Pub. Date: Dec. 21, 2017

(65) Prior Publication Data
US 2019/0229267 A1 Jul. 25, 2019

(30) Foreign Application Priority Data
Jun. 14, 2016 (DE) .................. 10 2016 110 884

(51) Int. Cl.
*H01L 51/00* (2006.01)
*H01L 21/56* (2006.01)
(Continued)

(52) U.S. Cl.
CPC ........ *H01L 51/0011* (2013.01); *C23C 14/042* (2013.01); *C23C 16/042* (2013.01);
(Continued)

(58) Field of Classification Search
None
See application file for complete search history.

(56) References Cited

U.S. PATENT DOCUMENTS 5,232,508 A * 8/1993 Arena .................. C23C 16/44
118/715
6,258,223 B1 * 7/2001 Cheung ............ H01L 21/68721
204/242

(Continued)

FOREIGN PATENT DOCUMENTS

DE    10 2010 000 447 A1    8/2011
KR       2015/0044728 A      4/2015
WO       2010/114274 A2     10/2010

OTHER PUBLICATIONS

International Search Report dated Aug. 28, 2018, from the ISA/EPO, for International Patent Application No. PCT/EP2017/063893 (filed Jun. 8, 2017), 5 pages.

(Continued)

*Primary Examiner* — Herve-Louis Y Assouman
(74) *Attorney, Agent, or Firm* — Ascenda Law Group, PC

(57) ABSTRACT

A device for depositing a layer onto one or more substrates includes a process chamber; a gas inlet element, which can be temperature-controlled, for delivering a process gas into the process chamber in a flow direction towards the substrates; a shielding element, arranged directly after the gas inlet element in the flow direction and which, when in a shielding position, thermally insulates the gas inlet element and the substrates from each other; mask holders arranged after the shielding element in the flow direction, each for holding a mask; and substrate holders for holding at least one of the substrates, each substrate holder corresponding to one of the plurality of mask holders. For each of the substrate holders, a displacement element is provided for displacing the substrate holder from a position distant from the mask holder to a position adjacent to the mask holder.

10 Claims, 2 Drawing Sheets

(51) Int. Cl.
| | |
|---|---|
| *C23C 14/56* | (2006.01) |
| *C23C 16/04* | (2006.01) |
| *C23C 16/455* | (2006.01) |
| *C23C 14/04* | (2006.01) |
| *C23C 16/458* | (2006.01) |
| *C23C 16/52* | (2006.01) |
| *H01L 51/56* | (2006.01) |

(52) U.S. Cl.
CPC ...... *C23C 16/4557* (2013.01); *C23C 16/4583* (2013.01); *C23C 16/45572* (2013.01); *C23C 16/52* (2013.01); *H01L 51/001* (2013.01); *H01L 51/56* (2013.01)

(56) References Cited

U.S. PATENT DOCUMENTS

| | | | |
|---|---|---|---|
| 7,964,037 B2 | 6/2011 | Fukuda et al. | |
| 2011/0147363 A1* | 6/2011 | Yap | H01L 21/68792 |
| | | | 219/385 |
| 2013/0040054 A1* | 2/2013 | Strauch | C23C 14/541 |
| | | | 427/248.1 |
| 2014/0322852 A1 | 10/2014 | Joo et al. | |
| 2014/0374250 A1* | 12/2014 | Ishihara | C23C 14/3464 |
| | | | 204/298.11 |

OTHER PUBLICATIONS

Written Opinion dated Aug. 28, 2018, from the ISA/EPO, for International Patent Application No. PCT/EP2017/063893 (filed Jun. 8, 2017), 5 pages.

International Preliminary Report on Patentability dated Dec. 18, 2018, from the International Bureau of WIPO, for International Patent Application No. PCT/EP2017/063893 (filed Jun. 8, 2017), with English translation, 13 pages.

Written Opinion dated Aug. 28, 2018, from the ISA/EPO, for International Patent Application No. PCT/EP2017/063893 (filed Jun. 8, 2017), English translation only, 6 pages.

* cited by examiner

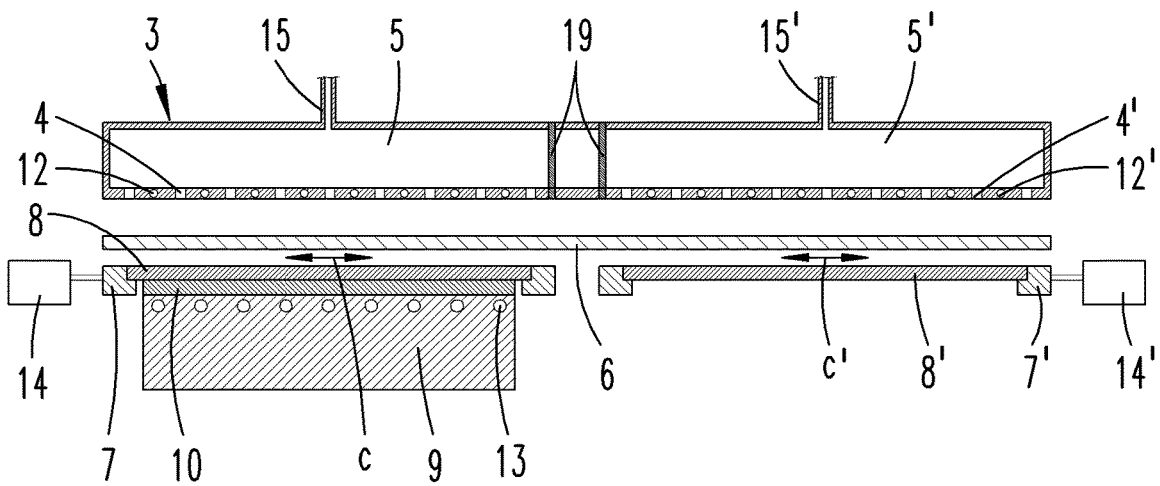
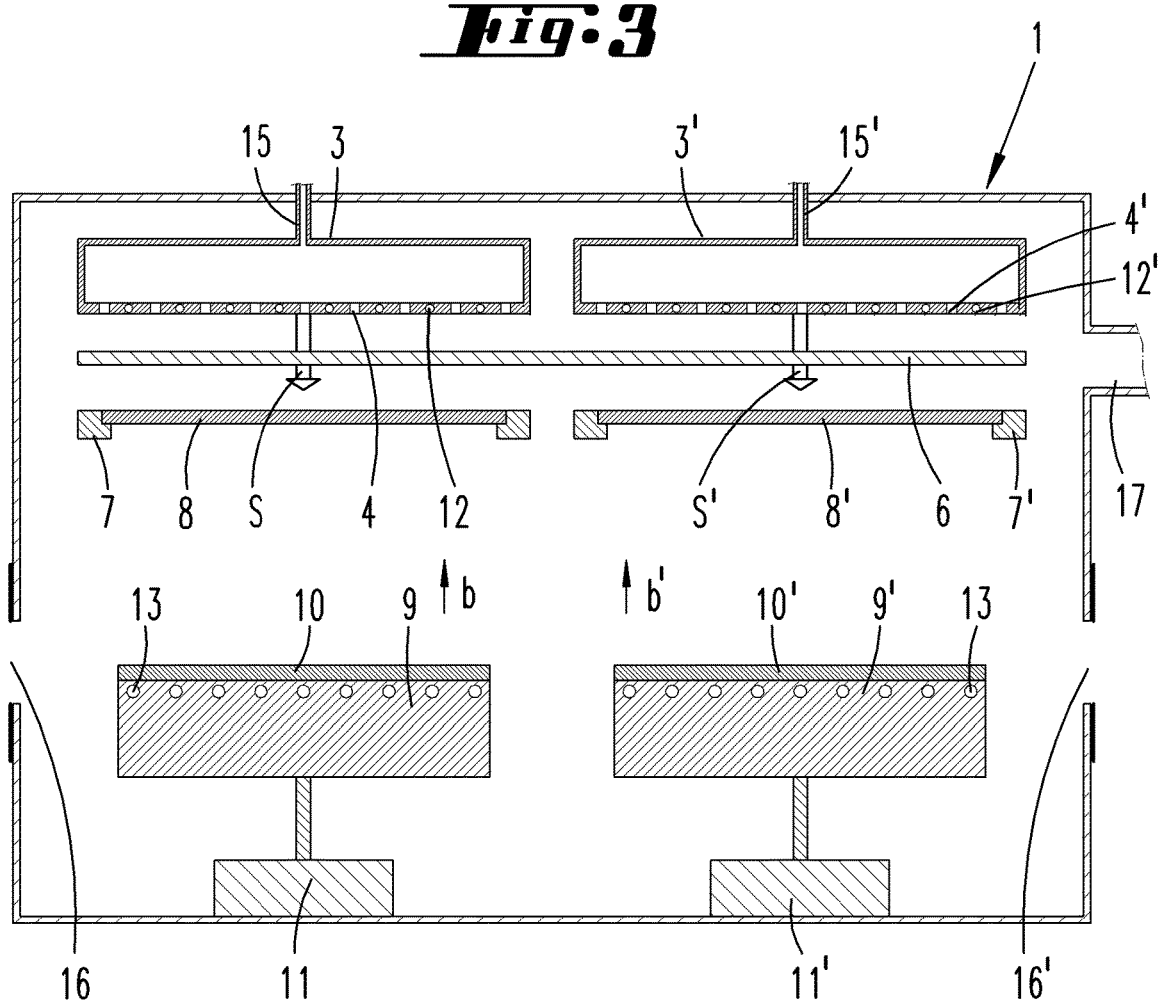

COATING DEVICE AND COATING METHOD

RELATED APPLICATIONS

This application is a National Stage under 35 USC 371 of and claims priority to International Application No. PCT/EP2017/063893, filed 8 Jun. 2017, which claims the priority benefit of DE Application No. 10 2016 110 884.7, filed 14 Jun. 2016.

FIELD OF THE INVENTION

The invention pertains to a device for depositing a layer onto one or more substrates, which comprises a process chamber that is arranged in a reactor housing. A gas inlet element is provided, which can be temperature-controlled and into which a process gas is introduced. The gas inlet element has a gas discharge surface, through which process gas can flow into the process chamber in a process gas flow direction. A shielding element is provided downstream of the gas inlet element with respect to the flow direction in order to thermally insulate the gas inlet element and the substrate from one another. The shielding element is located between the gas discharge surface of the gas inlet element and the mask holder. During the coating process, the mask holder carries a mask for laterally structuring the substrate to be coated. While the substrate is coated, the mask lies on the surface of the substrate, which is carried by a temperature-controllable substrate holder, in a contacting manner. The device is used for depositing OLED layers onto essentially rectangular substrates. The organic materials being deposited onto the substrate are capable of illuminating in the three primary colors by applying a voltage to these organic materials or by letting a current flow through them, respectively. Displays for screens, display panels or the like are manufactured with thusly produced substrates.

BACKGROUND

U.S. Pat. No. 7,964,037 B2 discloses a process chamber with a central gas inlet element, the gas discharge openings of which can be closed with a "shutter." Two substrate holders are provided diametrically opposite of one another with respect to the gas inlet element and respectively carry a substrate, which is covered by a mask, such that a structured surface can be deposited onto the substrate after the "shutter" has been opened.

US 2014/0322852 A1 discloses a device for depositing organic layers, wherein a material source that forms the gas inlet element can be displaced relative to multiple substrates, which are respectively arranged on a substrate holder, transverse to a flow direction.

WO 2010/114274 A1 describes a device for simultaneously coating multiple substrates, which are arranged on substrate holders that are individually assigned to each substrate, wherein gas inlet elements are individually assigned to the substrates.

DE 10 2010 000 447 A1 describes a process chamber with a gas inlet element and a substrate holder that lies in the flow path of a process gas flow exiting the gas discharge surface of the gas inlet element. The substrate holder can be displaced relative to the gas inlet element in the flow direction. A shielding element is provided and can be moved between the substrate holder and the gas discharge surface of the gas inlet element. The structured deposition of layers onto a substrate lying on the substrate holder is realized by using masks.

SUMMARY OF THE INVENTION

The invention is based on the objective of improving the process efficiency of a device for depositing organic layers.

This objective is attained with the invention disclosed in the claims, wherein each claim represents an independent solution to the objective and the dependent claims not only represent advantageous enhancements of the coordinate claims, but also independent solutions to the objective.

It is initially and essentially proposed that the device for depositing OLED layers has the following characteristic features: at least one temperature-controllable gas inlet element is provided for introducing a process gas into the process chamber. The gas inlet element has a gas discharge surface, through which a process gas can exit the gas inlet element. The direction, in which the process gas flow exits the gas discharge surface of the gas inlet element, defines a flow direction. It is furthermore proposed that at least one shielding element is arranged directly downstream of the gas inlet element with respect to the flow direction of the process gas flow, wherein said shielding element thermally insulates the gas inlet element and the substrate from one another in a shielding position. During the deposition of OLED layers, the gas inlet element, particularly the gas discharge surface of the gas inlet element, has a temperature that is higher than the temperature of the substrate. The at least one shielding element has the function of at least reducing a heat transfer from the gas inlet element to the substrate and to the mask held by the mask holder, respectively. Multiple mask holders for respectively holding a mask are arranged downstream of the at least one shielding element with respect to the flow direction. The gas discharge surface of the gas inlet element preferably extends in a gas discharge plane. The at least one shielding element extends in a plane that lies parallel to the gas discharge plane. The mask holders are likewise arranged in a common plane that extends parallel to the gas discharge plane. According to the invention, multiple substrate holders are provided. Each substrate holder is designed for holding at least one substrate, wherein the at least one substrate respectively extends in a plane that lies parallel to the gas discharge plane. The substrate holders are separated from one another. One substrate holder corresponds to each mask holder. The substrate holders are arranged downstream of the masks with respect to the flow direction and can be displaced in the direction toward the masks. A displacement element is provided for this purpose, wherein each substrate holder has an individually assigned displacement element, by means of which the substrate holder can be moved from a distant position from the mask holder into an adjoining position with the mask holder. In the distant position from the mask holder, substrates can be loaded on or unloaded from the substrate holder. In this case, the shielding element is in the shielding position such that the surface temperature of the substrate cannot rise above the process temperature, which preferably lies below 100° C., particularly below 60° C., in the distant position. This is particularly advantageous if the substrate is placed onto the surface of the substrate holder with the aid of a gripper. The surface of the substrate holder is actively temperature-controlled. It is particularly cooled to a temperature below 100° C., particularly below 60° C., by means of a cooling device. In order to deposit at least one layer onto the substrate, the substrate holder is moved into an adjoining position with the mask holder by means of the displacement element. In this position, the surface of the substrate to be coated is covered by the mask, which is preferably realized in the form of a shadow mask, such that the coating only takes place at the locations defined by the mask. The mask may comprise a plurality of regularly arranged openings such that pixel structures of a screen can be produced with the mask. In the adjoining position, the mask lies on the substrate in a contacting manner. The shielding element may be composed of multiple parts. It may consist of multiple shielding plates that extend parallel to the surface of the mask. However, it is preferred that the shielding element is realized in the form of one shielding plate that is arranged parallel to the mask. Multiple shielding elements may be provided. It is preferred that the shielding element is a unitary element. It is displaced in its plane from the shielding position into a storage position by means of a drive element, wherein the shielding element lies in a storage space in the storage position. The gas inlet element may comprise a heating element. The gas inlet element preferably forms a shower head with a gas discharge surface that comprises a plurality of gas discharge openings. The gas discharge surface may be formed by a gas discharge plate, in which a plurality of heating element channels are arranged. The gas discharge plate may be heated electrically. However, a liquid heating system is also provided. According to an enhancement of the invention, which also has independent character, adjusting devices are provided for adjusting the relative position of the mask and the substrate. The adjusting devices particularly are capable of displacing the mask relative to the substrate in the mask plane. This is particularly advantageous if displays are deposited. The position of the pixels or subpixels of the display can be adjusted in a highly precise manner with the adjusting device. Multiple layers that differ from one another can be successively deposited, wherein the position of the mask relative to the substrate is changed between the individual deposition steps in such a way that pixels, which illuminate in different colors, are deposited onto the substrate adjacent to one another. The adjusting device may have a spindle drive, a pneumatic drive or a hydraulic drive. However, the substrate holder may also be moved instead of the mask holder for the position adjustment. The gas inlet element may be a unitary shower head that comprises only one supply opening or only one gas distribution chamber, respectively. However, it is also possible to provide means such as diaphragms, by means of which the gas distribution volume of the gas inlet element can be divided into multiple individual volumes. It is also possible to use two separate gas inlet elements, wherein each gas inlet element is functionally assigned to a mask holder or a substrate holder, respectively. However, the gas discharge surfaces of the multiple gas inlet elements preferably lie in a common plane. It would furthermore be conceivable that a physically unitary gas inlet element comprises multiple gas distribution volumes that are permanently separated from one another and can be individually supplied with a process gas or a flushing gas. The flow direction is preferably a vertical direction, wherein the flow may take place from the bottom to the top or from top to the bottom. In this case, the substrate holder is displaced from the loading position into a processing position in the vertical direction. The position of the mask relative to substrate is adjusted in a horizontal direction in this case.

The invention furthermore pertains to a method for depositing a layer onto one or more substrates with the following steps:

using a device according to one of the preceding claims;
loading at least one of the substrate holders in its distant position from the mask holder;
simultaneously displacing at least one of the substrate holders loaded with substrates from its distant position into its adjoining position; and
depositing a layer, which is laterally structured due to the utilization of the mask, onto the substrates by introducing a process gas into the gas distribution volumes assigned to the loaded substrate holders.

Instead of a large substrate that has to be divided after the coating process in order to produce smaller substrates, a plurality of smaller substrates, which do not have to be divided after the coating process, are coated in a common process chamber. Each substrate is held by an individually assigned substrate holder, wherein each substrate holder preferably holds a single substrate, particularly a rectangular substrate. The position of the mask relative to the substrate is likewise adjusted individually. The gas inlet element may be realized in the form of a common gas inlet element that is supplied with a uniform process gas, which is evenly discharged from all gas discharge openings of the gas discharge surface such that all substrates are essentially processed with the same process parameters. However, it is also possible to load only a few of the substrate holders with substrates such that the device comprises loaded and empty substrate holders during the coating process. For this purpose, the gas inlet element is preferably enhanced in such a way that the gas distribution volume of the gas inlet element can be divided into multiple gas distribution volumes. Process gas is only introduced into the gas distribution volumes assigned to a loaded substrate holder. In contrast, a flushing gas or a carrier gas is introduced into the gas distribution volumes assigned to an empty substrate holder. In this case, the gas flow of the flushing gas or carrier gas corresponds to the gas flow of the process gas. In a preferred embodiment of the invention, the process chamber comprises two substrate holders and two mask holders that lie adjacent to one another.

The gas inlet element may also comprise two gas distribution volumes that are permanently separated from one another. It is also proposed that two gas inlet elements are arranged adjacent to one another. The substrates are loaded on and unloaded from the substrate holders in an operating state, in which all substrate holders assume their distant position, wherein a loading port, through which the substrates can be transported by means of a gripper, is provided in the wall of the reactor housing. The loading/unloading port preferably lies in the same plane as the substrate holders in their distant position. The loading and unloading processes therefore take place at temperatures below be process temperature, which is lower than 60° C. The loaded substrate holders are then jointly and simultaneously displaced in the direction of the gas inlet element and subsequently processed simultaneously, wherein the coating process for all substrate begins at the same time and ends at the same time.

The invention advantageously allows the simultaneous coating of multiple substrates on multiple substrate holders in a single process chamber.

BRIEF DESCRIPTION OF THE DRAWINGS

Exemplary embodiments of the invention are described below with reference to the attached drawings. In these drawings:

FIG. 2 shows an illustration of only the gas inlet element 3, the mask holders 7, 7' and a substrate holder 9 of a second exemplary embodiment; and FIG. 3 shows an illustration according to FIG. 1 of a third exemplary embodiment of the invention.

DETAILED DESCRIPTION

Figure 1:
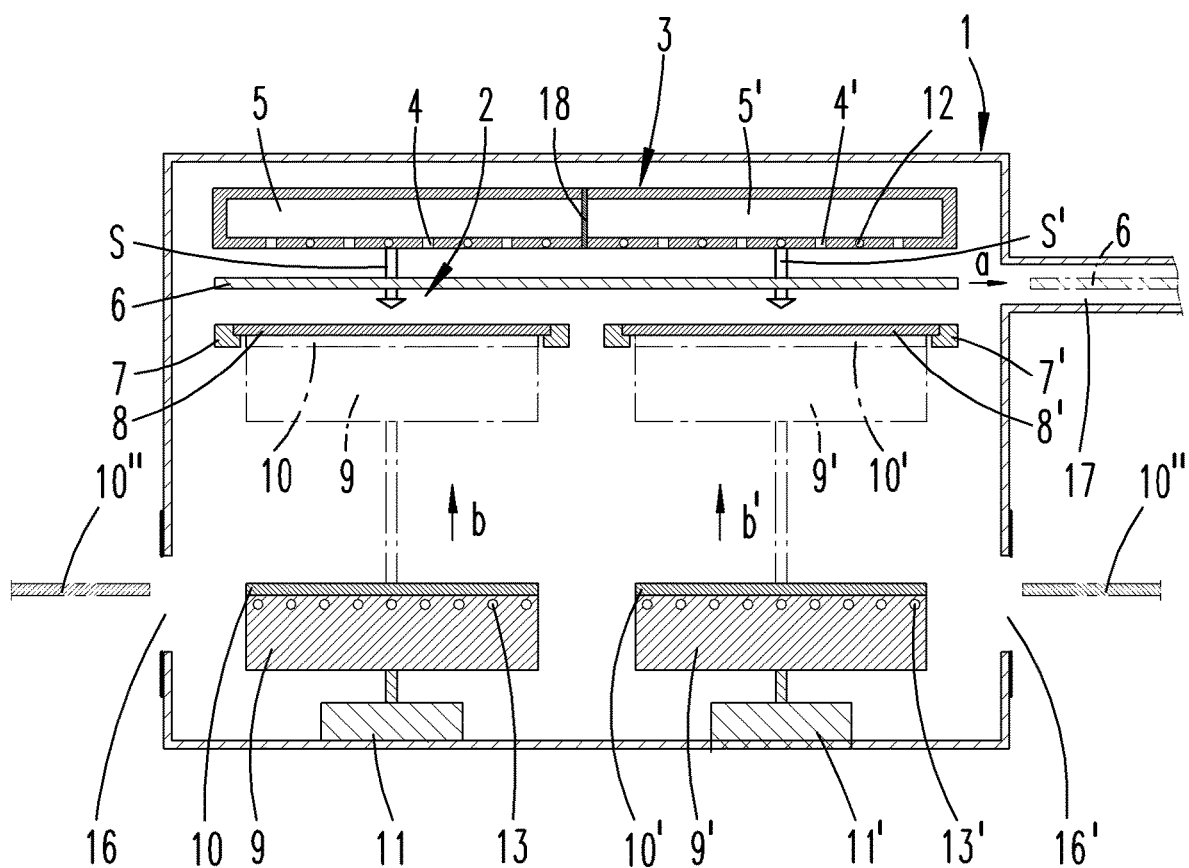
FIG. 1 shows a first schematic section through a coating device.

The inventive device is a reactor for depositing OLED layers, for example onto rectangular glass substrates 10, 10'. Two substrate holders 9, 9', which are physically separated from one another, are arranged in the reactor housing 1 in order to hold the substrates 10, 10'. The substrate holders 9, 9' can be displaced parallel to one another in the direction of the arrows b, b' by means of displacement devices 11, 11'. Each substrate holder 9, 9' has a temperature control device 13, 13' in the form of a cooling device. The substrate holders 9, 9' particularly can be temperature-controlled individually. The cooling device 13 may be realized in the form of a cooling channel, through which a cooling liquid flows. The coolant can be supplied to the cooling channels 13 by means of flexible lines, for example by means of hoses.

A unitary gas inlet element 3 is provided in the embodiment illustrated in FIG. 1. The gas inlet element 3 may comprise one or more not-shown supply lines, through which a process gas can be introduced into a gas volume of the gas inlet element 3. The gas volume may be a unitary gas volume. The reference symbol 18 identifies a wall, which is not provided in an exemplary embodiment, in which the gas volumes 5, 5' are realized unitarily. Two or more gas supply lines may also be provided and respectively assigned to one of the two gas volumes 5, 5'. The partition wall 18 may be movable or immovable. If the wall 18 is realized movably, it can be displaced into a separating position, in which the two gas volumes 5, 5' are separated from one another. However, it can also be displaced into a position, in which the gas volumes 5, 5' are fluidically connected to one another.

The arrows S, S' symbolize process gas flows from a gas discharge surface of a gas inlet element 3, which comprises a plurality of adjacently arranged gas discharge openings 4, 4'. The gas discharge plate forming the gas discharge openings 4, 4' may furthermore comprise heating elements 12, by means of which the gas discharge plate can be heated to a temperature above 400° C. The heating elements 12 may be realized in the form of wires that emit heat when an electrical current passes through them or in the form of channels, through which a hot liquid flows.

In a design variation of the gas inlet element 3, the wall 18 forms a diaphragm that selectively divides the unitary gas distribution volume 5 into two gas distribution volumes 5, 5'. In this variation, the gas inlet element 3 has multiple gas supply lines.

A planar shielding element 6, which may be formed by a metal plate, is spaced apart from the gas discharge surface of the gas inlet element 3 with respect to the flow direction S, S'. The shielding element 6 may be actively temperature-controlled, for example cooled or heated. The shielding element 6 can be moved from a shielding position, in which it covers the gas discharge surface in the flow direction S, S', into a storage position by displacing the shielding element 6 in the direction of the arrow a. It can be moved into a storage space 17, in which the shielding element 6 is stored during the deposition process.

In its shielding position, the shielding element 6 shields two or more mask holders 7, which are arranged in a plane that lies parallel to the gas discharge surface, from the thermal radiation emitted by the gas inlet element 3. The mask holders 7, 7' lie in a common plane that extends parallel to the gas discharge plane. The mask holders 7, 7' are formed by frames that carry the edge of a mask 8, 8'. The mask serves for structuring the layers to be deposited onto the substrate 10, 10' into individual pixels/subpixels.

In the exemplary embodiment illustrated in FIG. 1, the gas inlet element 3 is arranged on the top in the reactor housing 1. The shielding element 6 is located directly underneath the gas inlet element 3. The two mask holders 7, 7', which respectively carry a mask 8, 8', are located underneath the shielding element 6.

The two substrate holders 9, 9', which are respectively loaded with a substrate, are located underneath and spaced apart from the mask holders 7, 7', wherein said substrate holders can be displaced vertically upward by means of displacement devices 11, 11'. This takes place in the direction of the arrows b, b'.

The substrate holders 9 can be displaced upward until the substrates 10, 10' adjoin the masks 8, 8' in a contacting manner. However, it is also proposed that a slight intermediate space remains between the underside of the masks 8, 8' and the upper side of the substrates 10, 10' in order to align the masks 8, 8' relative to the substrates 10, 10' by means of a horizontal displacement.

The device illustrated in FIG. 1 is particularly suitable for use in a cluster system. In this case, the substrates are introduced into the reactor housing 1 through the loading and unloading port 16. The loading and unloading port 16 can be sealed in a vacuum-tight manner.

FIG. 2 shows a second exemplary embodiment of the invention, in which the aforementioned adjusting device 14 for the position adjustment of the mask 8, 8' relative to the substrate 10, 10' is illustrated in the form of a functional element. The adjusting direction, in which the adjusting device 14 displaces the mask 8, 8' relative to the substrate 10, 10', is indicated with the arrows c, c'.

In contrast to the first exemplary embodiment, the gas inlet element 3 in the second exemplary embodiment according to FIG. 2 is divided into separate gas distribution volumes 5, 5' by means of partition walls 19, wherein each gas distribution volume 5, 5' is individually assigned to a mask holder 7, 7' or to a substrate holder 9, 9', respectively. However, the shielding element 6 is a unitary shielding element. It is particularly realized in the form of a material-unitary shielding plate. The supply of the gas distribution volumes 5, 5' is realized by means of individual gas inlet nozzles 15, 15'. The partition wall 19 may be designed such that no dead space is formed. The dead space between the two partition walls 10 illustrated in FIG. 2 can be flushed with an inert gas or used for supplying a gas, for example an inert gas or a carrier gas, into the intermediate region.

When two substrates 10, 10' are coated simultaneously, it is preferred that the same gas mixture is introduced into the gas distribution chambers 5, 5' through both gas inlet nozzles 15, 15' such that a layer with the same layer properties is simultaneously deposited onto the substrates 10, 10' lying on the substrate holders 9, 9'. For this purpose, the substrate holders 9, 9' are simultaneously moved from the remote position into the adjoining position and after the completion of the coating process simultaneously moved from the adjoining position back into the distant position.

The exemplary embodiment illustrated in FIG. 3 essentially differs from the above-described exemplary embodiments in the design of the gas inlet element 3, 3'. In this case, two gas inlet elements 3, 3' are provided, which are physically separated from one another. They are shielded from the mask holders 7, 7' and the masks 8, 8' held by the mask holders 7, 7' by means of a unitary shielding element 6.

The device illustrated in FIG. 3 is particularly suitable for use in an in-line system. A loading opening 16 is arranged opposite of an unloading opening 16'. The substrates are introduced into the reactor housing 1 through the loading opening 16 by means of a gripper and placed on the substrate holders 9, 9'. The loading opening 16 and the unloading opening 16' are sealed in a gas-tight manner. An inert gas atmosphere is adjusted within the reactor housing at a desired pressure by introducing an inert gas and evacuating the inert gas by means of a not-shown vacuum pump. The substrate holders 9, 9' loaded with the substrates 10, 10' are simultaneously moved from the distant position into the adjoining position. After the deposition of the layer, the substrate holders 9, 9' are simultaneously moved back into the remote position. The substrates 10, 10' can be removed from the substrate holders 9, 9' after the unloading opening 16' has been opened.

In the above-described devices, however, fewer substrate holders than provided can be simultaneously loaded with substrates such that the number of substrates being simultaneously coated is smaller than the number of substrate holders 9, 9' provided. For example, only a single substrate, which is placed on only one of the two substrate holders 9, 9', can be coated in these devices. No substrate is placed on the other respective substrate holder 9, 9'. During the deposition process, a process gas only flows toward the substrate covered by the mask 8, 8' in the flow direction S, S' through the gas discharge openings 4, 4', which are functionally assigned to the loaded substrate holder 9, 9'. A carrier gas flows through the gas discharge openings 4, 4', which are functionally assigned to the empty substrate holder 9, 9', in order to achieve a flow balance and to avoid dead volumes.

The preceding explanations serve for elucidating all inventions that are included in this application and respectively enhance the prior art independently with at least the following combinations of characteristics, namely:

A device for depositing a layer onto one or more substrates 10, which comprises a process chamber 2 that is arranged in a reactor housing 1 and has the following characteristic features:
a) at least one temperature-controllable gas inlet element 3 for introducing a process gas flow into the process chamber 2 in a flow direction S toward the substrates 10;
b) at least one shielding element 6 that is arranged directly downstream of the gas inlet element 3 with respect to the flow direction S and thermally insulates the gas inlet element 3 and the substrate 10 from one another in a shielding position;
c) multiple mask holders 7, 7' that are arranged downstream of the shielding element 6 with respect to the flow direction S and respectively serve for holding a mask 8, 8';
d) substrate holders 9, 9' that respectively correspond to one or more mask holders 7, 7' and are arranged downstream of the masks 8, 8' with respect to the flow direction S, wherein said substrate holders are physically separated from one another and serve for holding at least one of the substrates 10; and
e) displacement elements 11, 11' that are assigned to each of the multiple substrate holders 9, 9' and serve for displacing the substrate holders 9, 9' from a distant position from the mask holders 7, 7', in which the substrates 10, 10' can be loaded on and unloaded from the substrate holders 9, 9', into an adjoining position with the mask holders 7, 7', in which a substrate 10, 10' arranged on the substrate holder 9, 9' can be coated in a contact position with the mask 8, 8';
f) wherein the shielding element (6) is a unitary shielding element or multiple shielding elements are provided, and wherein the one or more shielding elements are simultaneously arranged between all mask holders (7, 7') and all gas discharge surfaces of the at least one gas inlet element (3) in their shielding position and simultaneously accommodated in a storage space (17) during the simultaneous coating of multiple substrates (10, 10').

The device according to claim 1, characterized in that the substrate holders 9, 9' can be individually temperature-controlled and individually displaced.

The device according to one or more of the preceding claims, characterized in that the shielding element 6 is a uniform shielding element or multiple shielding elements are provided, wherein the one or more shielding elements are preferably arranged between all mask holders 7, 7' and the at least one gas inlet element 3 in the shielding position.

The device according to one or more of the preceding claims, characterized in that the gas inlet element 3 comprises a heating element 12 and the substrate holder 9, 9' comprises a cooling element 13, 13'.

The device according to one or more of the preceding claims, characterized by adjusting devices 14, 14' for individually adjusting the position of a mask holder 7, 7' relative to the substrate holder 9, 9' assigned thereto.

The device according to one or more of the preceding claims, characterized in that multiple gas inlet elements 3, 3' are arranged adjacent to one another or in that one gas inlet element 3 comprises two gas distribution volumes 5, 5', which are separated from one another by a movable diaphragm 18.

A method for depositing a layer onto one or more substrates with the following steps:
using a device according to one of the preceding claims;
loading at least one of the substrate holders 9, 9' in its distant position from the mask holder 7, 7';
simultaneously displacing at least the substrate holders 9, 9' loaded with substrates 10, 10' from their distant position into their adjoining position; and
depositing a layer, which is laterally structured due to the utilization of the mask 8, 8', onto the substrates 10, 10' by introducing a process gas into the gas distribution volumes 5, 5' assigned to the loaded substrate holders 9, 9'.

The method according to claim 7, characterized in that at least one substrate holder 9, 9' remains empty, and in that a flushing gas, which flows toward the mask holder in the flow direction S, is introduced into the gas distribution volume 5, 5' assigned to the empty substrate holder 9, 9'.

The method according to one of claims 7-9, characterized in that layers structured by the mask 8 are deposited onto the substrate 10 in multiple successive steps, wherein layer structures, which lie laterally adjacent to one another, are produced on the substrate 10, 10' by laterally changing the position of a mask holder 7, 7' relative to the substrate holder 9, 9' assigned thereto.

The method according to one of claim 7 or 8, characterized in that OLED layers are deposited, wherein the temperature of the gas inlet element 3, 3' is higher than the temperature of the substrate holders 9, 9'.

All disclosed characteristic features are essential to the invention (individually, but also in combination with one another). The disclosure content of the associated/attached priority documents (copy of the priority application) is hereby fully incorporated into the disclosure of this application, namely also for the purpose of integrating characteristic features of these documents into claims of the present application. The characteristic features of the dependent claims characterize independent inventive enhancements of the prior art, particularly for submitting divisional applications on the basis of these claims.

LIST OF REFERENCE SYMBOLS

1 Reactor housing
2 Process chamber
3 Gas inlet element
3' Gas inlet element
4 Gas discharge opening
4' Gas discharge opening
5 Gas distribution volume
5' Gas distribution volume
6 Shielding element
7 Mask holder
7' Mask holder
8 Mask
8' Mask
9 Substrate holder
9' Substrate holder
10 Substrate
10' Substrate
10" Substrate
11 Displacement device
11' Displacement device
12 Heating element
13 Cooling element
13' Cooling element
14 Adjusting device
14' Adjusting device
15 Gas inlet
15' Gas inlet
16 Loading port
16' Unloading port
17 Storage space
18 Diaphragm
19 Partition wall
S Process gas flow
S' Process gas flow
a Arrow
b Arrow
b' Arrow
c Arrow
c' Arrow

What is claimed is:

1. A device for depositing a layer onto one or more substrates (10), the device comprising:
   a process chamber (2) arranged in a reactor housing (1);
   at least one temperature-controlled gas inlet element (3) for introducing a process gas into the process chamber (2) in a flow direction (S) toward the one or more substrates (10), wherein the process gas is discharged from a gas discharge surface of the at least one gas inlet element (3);
   at least one shielding element (6) that, when located in a shielding position, is arranged directly downstream of the at least one gas inlet element (3) with reference to the flow direction (S) and thermally insulates the at least one gas inlet element (3) and the one or more substrates (10) from one another;
   mask holders (7, 7') arranged downstream of the at least one shielding element (6) with respect to the flow direction (S) and respectively are configured to hold a mask (8, 8');
   substrate holders (9, 9') that respectively correspond to one or more of the mask holders (7, 7') and are arranged downstream of the masks (8, 8') with respect to the flow direction (S), wherein said substrate holders (9, 9') are physically separated from one another and are configured to hold at least one of the one or more substrates (10); and
   displacement elements (11, 11') assigned to each of the substrate holders (9, 9') and configured to displace the substrate holders (9, 9') from a first position distant from the mask holders (7, 7'), in which the one or more substrates (10, 10') are loaded on and unloaded from the substrate holders (9, 9'), to a second position adjoining the mask holders (7, 7'), in which at least one of the one or more substrates (10, 10') arranged on the substrate holders (9, 9') is coated while in contact with one or more of the masks (8, 8'),
   wherein the at least one shielding element (6) is a unitary shielding element or multiple shielding elements and is displaceable between the shielding position and a storage space (17),
   wherein the storage space (17) is formed as a slot in a wall of the reactor housing (1), the slot having a slot height that is less than a distance between the gas discharge surface of the at least one gas inlet element (3) and the mask holders (7, 7'),
   wherein, while the at least one shielding element (6) is located in the shielding position, the at least one shielding element (6) is arranged between all of the mask holders (7, 7') and an entirety of the gas discharge surface of the at least one gas inlet element (3), and
   wherein, while the at least one shielding element (6) is located in the storage space (17), the one or more substrates (10, 10') are coated.

2. The device of claim 1, wherein the substrate holders (9, 9') are individually temperature-controlled and individually displaced.

3. The device of claim 1, wherein the at least one gas inlet element (3) comprises a heating element (12) and the substrate holders (9, 9') comprise a cooling element (13, 13').

4. The device of claim 1, wherein the at least one gas inlet element (3) includes multiple gas inlet elements (3, 3') arranged adjacent to one another.

5. A device for depositing a layer onto one or more substrates (10), the device comprising:
   a process chamber (2) arranged in a reactor housing (1);
   at least one temperature-controlled gas inlet element (3) for introducing a process gas into the process chamber (2) in a flow direction (S) toward the one or more substrates (10);
   at least one shielding element (6) that, when located in a shielding position, is arranged directly downstream of the at least one gas inlet element (3) with reference to the flow direction (S) and thermally insulates the at least one gas inlet element (3) and the one or more substrates (10) from one another;
   mask holders (7, 7') arranged downstream of the at least one shielding element (6) with respect to the flow direction (S) and respectively are configured to hold a mask (8, 8');
   substrate holders (9, 9') that respectively correspond to one or more of the mask holders (7, 7') and are arranged downstream of the masks (8, 8') with respect to the flow direction (S), wherein said substrate holders (9, 9') are physically separated from one another and are configured to hold at least one of the one or more substrates (10);

displacement elements (11, 11') assigned to each of the substrate holders (9, 9') and configured to displace the substrate holders (9, 9') from a first position distant from the mask holders (7, 7'), in which the one or more substrates (10, 10') are loaded on and unloaded from the substrate holders (9, 9'), to a second position adjoining the mask holders (7, 7'), in which at least one of the one or more substrates (10, 10') arranged on the substrate holders (9, 9') is coated while in contact with one or more of the masks (8, 8'); and adjusting devices (14, 14') for individually adjusting a position of each of the mask holders (7, 7') relative to the substrate holder (9, 9') assigned thereto, wherein the at least one shielding element (6) is a unitary shielding element or multiple shielding elements and is displaceable between the shielding position and a storage space (17), wherein, while the at least one shielding element (6) is located in the shielding position, the at least one shielding element (6) is arranged between all of the mask holders (7, 7') and all gas discharge surfaces of the at least one gas inlet element (3), and wherein, while the at least one shielding element (6) is located in the storage space (17), the one or more substrates (10, 10') are coated.

6. A method for operating a device comprising a process chamber (2) arranged in a reactor housing (1); at least one temperature-controlled gas inlet element (3) for introducing a process gas into the process chamber (2) in a flow direction (S) toward the one or more substrates (10); at least one shielding element (6) that, when located in a shielding position, is arranged directly downstream of the at least one gas inlet element (3) with reference to the flow direction (S) and thermally insulates the at least one gas inlet element (3) and the one or more substrates (10) from one another; mask holders (7, 7') arranged downstream of the at least one shielding element (6) with respect to the flow direction (S) and respectively are configured to hold a mask (8, 8'); substrate holders (9, 9') that respectively correspond to one or more of the mask holders (7, 7') and are arranged downstream of the masks (8, 8') with respect to the flow direction (S), wherein said substrate holders (9, 9') are physically separated from one another and are configured to hold at least one of the one or more substrates (10); and displacement elements (11, 11') assigned to each of the substrate holders (9, 9') and configured to displace the substrate holders (9, 9') from a first position distant from the mask holders (7, 7'), in which the one or more substrates (10, 10') are loaded on and unloaded from the substrate holders (9, 9'), to a second position adjoining the mask holders (7, 7'), in which at least one of the one or more substrates (10, 10') arranged on the substrate holders (9, 9') is coated while in contact with one or more of the masks (8, 8'), wherein the at least one shielding element (6) is a unitary shielding element or multiple shielding elements and is displaceable between the shielding position and a storage space (17), the method comprising:

loading the one or more substrates (10, 10') onto one or more of the substrate holders (9, 9') located in the first position;

displacing the one or more substrate holders (9, 9') that have been loaded with the one or more substrates (10, 10') from the first position to the second position; and depositing a layer, which is laterally structured due to utilization of the masks (8, 8'), onto the one or more substrates (10, 10') by introducing the process gas into gas distribution volumes (5, 5') assigned to the one or more substrate holders (9, 9') that have been loaded with the one or more substrates (10, 10').

7. The method of claim 6, wherein at least one of the substrate holders (9, 9') remains empty, and wherein a flushing gas, is introduced into the gas distribution volume (5, 5') assigned to the at least one empty substrate holder (9, 9') and is flowed towards the at least one empty substrate holder (9, 9').

8. The method of claim 6, wherein layers structured by the masks (8) are deposited onto the one or more substrates (10) in multiple successive steps, and wherein layer structures, which lie laterally adjacent to one another, are produced on the one or more substrates (10, 10') by laterally changing a position of at least one of the mask holders (7, 7') relative to the substrate holder (9, 9') assigned thereto.

9. The method of claim 6, wherein organic light emitting diode (OLED) layers are deposited on the one or more substrates (10, 10'), and wherein a temperature of the at least one gas inlet element (3, 3') is higher than a temperature of the substrate holders (9, 9').

10. A device for depositing a layer onto one or more substrates (10), the device comprising:

a process chamber (2) arranged in a reactor housing (1);

at least one temperature-controlled gas inlet element (3) for introducing a process gas into the process chamber (2) in a flow direction (S) toward the one or more substrates (10), wherein the at least one gas inlet element (3) comprises two gas distribution volumes (5, 5') that are separated from one another by a movable diaphragm (18);

at least one shielding element (6) that, when located in a shielding position, is arranged directly downstream of the at least one gas inlet element (3) with reference to the flow direction (S) and thermally insulates the at least one gas inlet element (3) and the one or more substrates (10) from one another;

mask holders (7, 7') arranged downstream of the at least one shielding element (6) with respect to the flow direction (S) and respectively are configured to hold a mask (8, 8');

substrate holders (9, 9') that respectively correspond to one or more of the mask holders (7, 7') and are arranged downstream of the masks (8, 8') with respect to the flow direction (S), wherein said substrate holders (9, 9') are physically separated from one another and are configured to hold at least one of the one or more substrates (10); and displacement elements (11, 11') assigned to each of the substrate holders (9, 9') and configured to displace the substrate holders (9, 9') from a first position distant from the mask holders (7, 7'), in which the one or more substrates (10, 10') are loaded on and unloaded from the substrate holders (9, 9'), to a second position adjoining the mask holders (7, 7'), in which at least one of the one or more substrates (10, 10') arranged on the substrate holders (9, 9') is coated while in contact with one or more of the masks (8, 8'), wherein the at least one shielding element (6) is a unitary shielding element or multiple shielding elements and is displaceable between the shielding position and a storage space (17), wherein, while the at least one shielding element (6) is located in the shielding position, the at least one shielding element (6) is arranged between all of the mask holders (7, 7') and all gas discharge surfaces of the at least one gas inlet element (3), and wherein, while the at least one shielding element (6) is located in the storage space (17), the one or more substrates (10, 10') are coated.

\* \* \* \* \*